(12) United States Patent
Boettcher

(10) Patent No.: US 11,747,366 B2
(45) Date of Patent: Sep. 5, 2023

(54) CURRENT SENSOR FOR NON-CONTACT CURRENT MEASUREMENT

(71) Applicant: Vacuumschmelze GmbH & Co. KG, Hanau (DE)

(72) Inventor: Steffen Boettcher, Hanau (DE)

(73) Assignee: VACUUMSCHMELZE GMBH & CO. KG, Hanau (DE)

( * ) Notice: Subject to any disclaimer, the term of this patent is extended or adjusted under 35 U.S.C. 154(b) by 30 days.

(21) Appl. No.: 17/577,469

(22) Filed: Jan. 18, 2022

(65) Prior Publication Data
US 2022/0276283 A1     Sep. 1, 2022

(30) Foreign Application Priority Data
Feb. 26, 2021   (DE) .......................... 102021104752.8

(51) Int. Cl.
| | | |
|---|---|---|
| G01R 15/18 | (2006.01) | |
| G01R 19/00 | (2006.01) | |
| H01F 27/28 | (2006.01) | |
| H01F 27/24 | (2006.01) | |

(52) U.S. Cl.
CPC ......... *G01R 15/18* (2013.01); *G01R 19/0092* (2013.01); *H01F 27/24* (2013.01); *H01F 27/28* (2013.01)

(58) Field of Classification Search
None
See application file for complete search history.

(56) References Cited

U.S. PATENT DOCUMENTS

| | | | | |
|---|---|---|---|---|
| 2012/0091996 A1* | 4/2012 | Koch | ................. | G01R 19/20 324/117 R |
| 2015/0293153 A1 | 10/2015 | Boettcher et al. | | |
| 2019/0178916 A1* | 6/2019 | Boettcher | ............ | G01R 15/183 |

FOREIGN PATENT DOCUMENTS

DE     102014105306 A1    10/2015

OTHER PUBLICATIONS

German Examination Report with English translation dated Nov. 19, 2021 for German Application No. 102021104752.8, 9 pages.

* cited by examiner

*Primary Examiner* — Douglas X Rodriguez
(74) *Attorney, Agent, or Firm* — Dickinson Wright PLLC

(57) ABSTRACT

A method for non-contact current measurement is described. According to one exemplary embodiment, the method comprises the alternating magnetizing of a magnetic core to a maximum value in the positive and negative directions by controlling at least one secondary conductor which is magnetically coupled to the magnetic core; generating an oscillator signal which alternates between a first state and a second state, whereby the alternating magnetization processes are indicated; and determining a first measured value for an effective primary current which flows through at least one primary conductor which is magnetically coupled to the magnetic core, based on the times that the oscillator signal dwells in the first and the second state.

17 Claims, 4 Drawing Sheets

CURRENT SENSOR FOR NON-CONTACT CURRENT MEASUREMENT

This U.S. patent application claims priority to DE Patent Application No. 102021104752.8, filed Feb. 26, 2021, the entire contents of which is incorporated herein by reference in its entirety.

BACKGROUND

1. Technical Area

The present description relates to sensor devices and methods for non-contact current measurement, in particular devices and methods based on the flux gate principle.

2. Related Art

So-called direct-imaging current sensors are known for non-contact and thus potential free current measurement. A direct-imaging current sensor measures the magnetic flux caused by the current to be measured, which depends on the amperage of the current to be measured. The measured value of the magnetic flux is also a measure of the amperage of the current to be measured. The conductor that carries the current to be measured is usually enclosed by a magnetic core (e.g. a toroidal core) that carries the magnetic field. Hall sensors, for example, can be used as sensor elements for the magnetic flux. Current sensors constructed in this way are inexpensive, but have a relatively low level of accuracy.

Another group of current sensors are so-called compensation current sensors, in which the magnetic field caused by the current to be measured in a magnetic core is compensated using a compensation winding which is arranged on the magnetic core and which generates an opposing magnetic field. Using a closed control loop, the compensation winding is controlled with a compensation current in such a way that the entire magnetic field in the magnet core is approximately zero. The zero point of the magnetic field can be detected by means of a magnetic field sensor element.

So-called flux gate current sensors form a special group of compensation current sensors. These sensors also have a mostly ring-shaped magnetic core with (at least) one primary winding, which carries the current to be measured, and with (at least) one secondary winding, which is part of an oscillator circuit. When the oscillator circuit is in operation, the magnetization of the magnet core is regularly reversed. For this purpose, the polarity of the current flowing through the secondary winding can always be reversed when magnetic saturation occurs in the magnetic core. Both the current through the secondary winding and the time to reach magnetic saturation depend on the current to be measured in the primary winding. With suitable subsequent signal processing, the influence of the hysteresis of the magnetic core can be eliminated and thus a very precise current measurement can be achieved.

For this reason, flux gate current sensors are also suitable for measuring differential currents. The differential current measurement represents a special case of total current measurement. In total current measurement two or more primary conductors are magnetically coupled to the toroidal core, so that the magnetic fields of the current flowing in the primary conductors currents are superimposed constructively in the ring core, which is why the current sensor measures the sum of the current flowing in the primary conductors. If two primary windings are now wound in such a way that the magnetic fields caused by the (primary) currents flowing in them are destructively superimposed in the toroidal core, then the current sensor measures the difference between the two primary currents. Current sensors suitable for differential current measurement are commonly used in residual current circuit breakers.

An example of a differential current sensor that works according to the flux gate principle is described in the publication US 2016/0033555 A1 (Böttcher et al.). The inventors have set themselves the object of improving existing current sensors based on the flux gate principle, in particular with regard to applications in which the currents or current differences to be measured are very small.

SUMMARY

The above-mentioned object is achieved by a circuit according to the present disclosure. Various exemplary embodiments and developments are the subject of disclosure.

According to one exemplary embodiment, a current sensor circuit comprises an oscillator circuit with a magnetic core, at least one primary conductor which is magnetically coupled to the magnetic core and at least one secondary conductor which is magnetically coupled to the magnetic core. The oscillator circuit is designed to magnetize the magnetic core regularly in opposite directions up to a maximum value by controlling the at least one secondary conductor. The oscillator circuit is further designed to generate an oscillator signal which alternates from a first state to a second state, or vice versa, when the maximum value is reached. The times that the oscillator signal dwells in the first and the second state depend on the effective primary current that flows through the at least one primary conductor. The current sensor circuit further comprises a time measuring circuit which is designed to regularly determine a first time period and a second time period that the oscillator signal dwells in the first or the second state in an oscillation period. An evaluation unit is designed to determine a difference between the first time period and the second time period and, based thereof, to determine a measured value for the effective primary current. In a specific embodiment, the effective primary current can be a differential current.

According to a further exemplary embodiment, a current sensor circuit comprises an oscillator circuit with a magnetic core, at least one primary conductor which magnetically coupled to the magnetic core, and at least one secondary conductor which is magnetically coupled to the magnetic core. The oscillator circuit is designed to magnetize the magnetic core regularly in opposite directions up to a maximum value by controlling the at least one secondary conductor. The oscillator circuit is further designed to generate an oscillator signal which has a duty cycle that depends on an effective primary current in the at least one primary conductor. A duty cycle amplifier circuit is designed to increase a deviation of the duty cycle from a reference value that is dependent on the effective primary current.

According to a further exemplary embodiment, a current sensor circuit comprises an oscillator circuit with a magnetic core, at least one primary conductor which magnetically coupled to the magnetic core, and at least one secondary conductor which is magnetically coupled to the magnetic core. The oscillator circuit is designed to magnetize the magnetic core regularly in opposite directions up to a maximum value by controlling the at least one secondary conductor. The oscillator circuit is further designed to generate an oscillator signal which alternates from a first state to a second state, or vice versa, when the maximum value is reached. An evaluation unit is designed to determine a first measured value for an effective primary current flowing through the at least one primary conductor based on the times that the oscillator signal dwells in the first and the second state, and, in parallel, to determine a second measured value for the effective primary current based on a secondary current flowing in the secondary conductor.

Further exemplary embodiments relate to methods for current measurement. In one exemplary embodiment, the method comprises alternating magnetizing a magnetic core to a maximum value in the positive and negative directions by controlling at least one secondary conductor which is magnetically coupled to the magnetic core; generating an oscillator signal which alternates between a first state and a second state, whereby the alternating magnetization processes are indicated; determining a first time period and a second time period that the oscillator signal dwells in the first or the second state in an oscillation period; and determining a measured value for an effective primary current flowing through at least one primary conductor which is magnetically coupled to the magnetic core, based on a difference between the first time period and the second time period.

In a further exemplary embodiment, the method comprises alternating magnetizing a magnetic core to a maximum value in the positive and negative directions by controlling at least one secondary conductor which is magnetically coupled to the magnetic core; generating an oscillator signal which alternates between a first state and a second state, whereby the alternating magnetization processes are indicated; and generating a modified oscillator signal with a duty cycle that deviates more from a reference value than a corresponding duty cycle of the oscillator signal that depends on an effective primary current flowing through at least one primary conductor which is magnetically coupled to the magnetic core.

In a further exemplary embodiment, the method comprises alternating magnetizing a magnetic core with a maximum value in the positive and negative directions by controlling at least one secondary conductor which is magnetically coupled to the magnetic core; generating an oscillator signal which alternates between a first state and a second state, whereby the alternating magnetization processes are indicated; determining a first measured value for an effective primary current that flows through at least one primary conductor which is magnetically coupled to the magnetic core, based on the times that the oscillator signal dwells in the first and the second state, and in parallel, determining a second measured value for the effective primary current based on a secondary current signal which represents the current flowing through the at least one secondary conductor.

BRIEF DESCRIPTION OF THE FIGURES

Various exemplary embodiments are explained in more detail below with reference to the figures. The illustrations are not necessarily true to scale and the invention is not limited to the aspects shown. Rather, emphasis is placed on illustrating the principles on which the illustrated exemplary embodiments are based.

In a block diagram.

In a diagram of magnetization over magnetic field strength.

In a current-time diagram.

In a diagram of magnetization over magnetic field strength.

In a current-time diagram.

In a block diagram.

DETAILED DESCRIPTION

Figure 1:
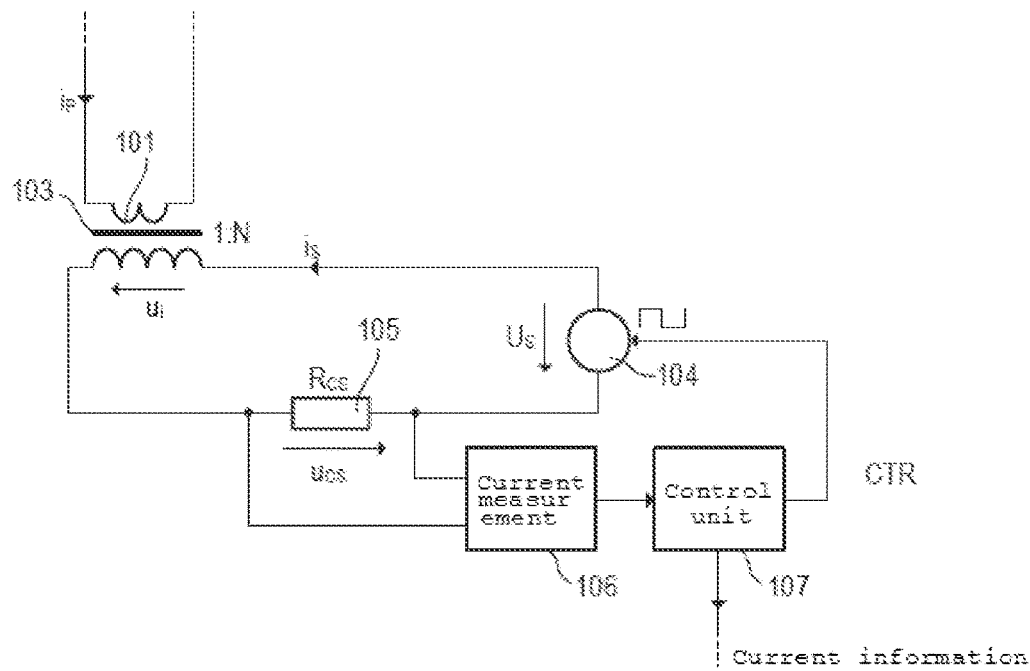
FIG. 1 shows a current sensor operating according to the flux gate principle.

As a block diagram, FIG. 1 shows an example of a current sensor operating according to the flux gate principle. In the illustrated example, the current sensor is to measure a current flowing through a primary conductor 101, hereinafter referred to as primary current $i_P$. The current sensor has a secondary conductor 102 and an, for example, unslotted annular magnetic core 103 made of soft magnetic material. The magnetic core 103 couples the primary conductor 101 and the secondary conductor 102 magnetically. Primary conductor 101 and secondary conductor 102 can each be designed unwound (magnetically effective number of turns equal to 1) or wound (number of turns greater than 1), wherein the number of turns of primary conductor 101 and secondary conductor 102 can be the same or different. For example, the primary conductor 101 can be guided in a straight line (unwound, number of turns equal to 1) through the annular core 103 and enclosed by the annular core 103. The secondary conductor 102 can be wound and have a number of turns N>1. In this case, the secondary conductor 102 is also referred to as a secondary winding.

The secondary conductor 102 is fed by a controlled voltage source 104 which, for example, generates an approximately rectangular bipolar source voltage±$U_S$ and thus drives a secondary current $i_S$ through the secondary conductor 102. The voltage source 104 can be implemented, for example, by means of a transistor H-bridge. To measure the secondary current $i_S$, a measuring resistor 105 with a resistance value $R_{CS}$ can be connected between the secondary conductor 102 and the voltage source 104. A voltage $U_{CS}$ across the measuring resistor 105 is picked up by means of a measuring unit 106, preprocessed (e.g. digitized) and fed to a control unit 107 in the form of a signal representing the secondary current $i_S$. The control unit 107 generates a control signal CTR for the voltage source 104 from it. Other concepts for measuring the secondary current are known. For example, when using a transistor bridge circuit as the voltage source 104, so-called sense transistors can be used for the current measurement.

Figure 2:
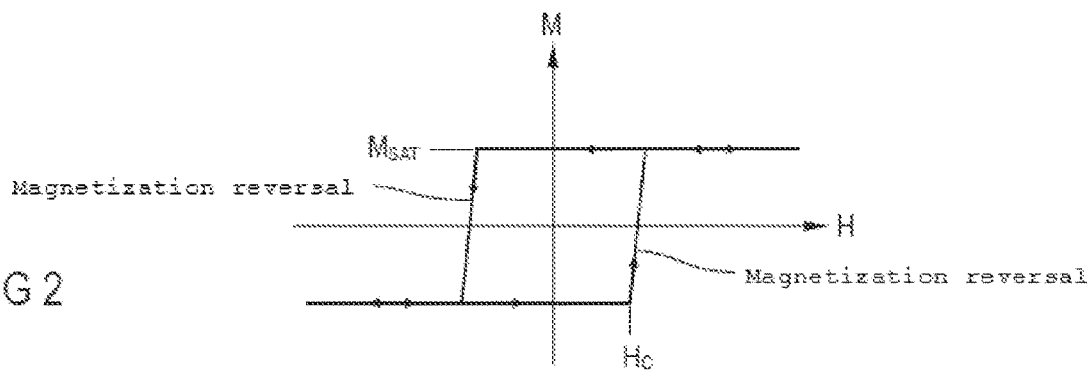
FIG. 2 shows the idealized course of the magnetization characteristic of the magnetic core in a freely oscillating current sensor at a primary current of zero.

The mode of operation of the current sensor shown in FIG. 1 is explained in more detail below with reference to FIGS. 2 to 5. The magnetization characteristic shown in FIG. 2 illustrates the ferromagnetic properties of the magnetic core 103 at a primary current of zero amperes, the magnetic field strength H being plotted on the abscissa and the magnetization M being plotted on the ordinate. The magnetization characteristic has an approximately rectangular hysteresis with a coercive field strength $H_C$ and a saturation magnetization $M_{SAT}$. For the magnetic field strength H, in accordance with Ampére's law, $H=i_S/l_{FE}\cdot N$ applies, where the parameter $l_{FE}$ denotes the effective magnetic path length of the magnetic field lines in the core 103 and N is the number of turns of the secondary conductor 102 if the number of turns of the primary conductor 101 is equal to 1.

For a voltage $u_i$ induced in the secondary conductor 102, according to Faraday's law:

$$u_i = -N \cdot d\Phi/dt = -N \cdot A \cdot dB/dt, \quad (1)$$

where A denotes the (effective) cross-sectional area of the core 103, $\Phi$ denotes the magnetic flux in the core 103 caused by the secondary current $i_S$, B denotes the magnetic flux density with $B=\mu_0 \cdot (H+M)$ and $\mu_0$ denotes the magnetic field constant. During the magnetization reversal of the core 103, which corresponds to the left or right vertical branch of the magnetization characteristic in FIG. 2, the rate of change of the magnetization dM/dt is proportional to the induced voltage $u_i$, the magnetic field strength H and thus also the secondary current $i_S$ being substantially constant, i.e.

$$u_i = -N \cdot A \cdot \mu_0 dM/dt \text{ (during magnetization reversal)} \quad (2)$$

In other words, the differential inductance of the secondary winding 102 during magnetization reversal is very large (idealized infinitely large). As soon as the magnetization in the core 103 has reached the saturation magnetization $M_{SAT}$, the secondary current $i_S$ increases and is only limited by the sum of the ohmic resistance value of the secondary conductor 102 and the ohmic resistance value $R_M$ of the measuring resistor 105.

Figure 3:
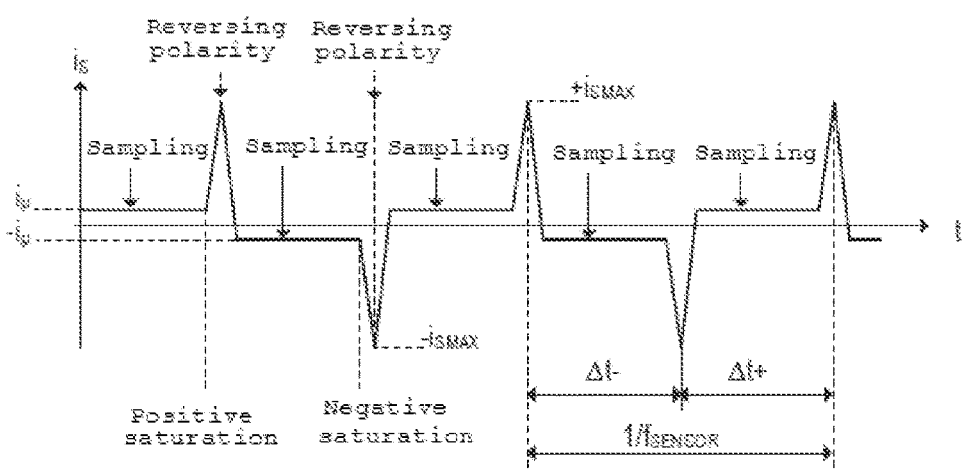
FIG. 3 shows the idealized course of the secondary current in a free-running current sensor at a primary current of zero.

The time course of the secondary current $i_S$ when the primary current $i_P$ is equal to zero is shown in FIG. 3. An (abrupt) increase in the secondary current $i_S$ (in the positive and negative directions) can be detected by the control unit 107, in which case, for example, comparators can be utilized. In the exemplary embodiment described here, the control unit 107 generates a signal to reverse the polarity of the voltage $U_S$ of the current source 104 as soon as the secondary current $i_S$ exceeds a positive threshold value $+i_{SMAX}$ or falls below a negative threshold value $-i_{SMAX}$, whereby the next magnetization reversal cycle is initiated. The voltage source 104, the secondary winding 102, the current measuring circuit 106 and the control unit 107 substantially form an oscillator circuit. As mentioned, the polarity of the voltage source 104 is usually reversed when magnetic saturation is reached, which in principle forms a relaxation oscillator. The specific implementation of the oscillator circuit (e.g. implementation of the current source, current measurement and detection of magnetic saturation) is not relevant in the concepts described here. Various possibilities are known per se.

During the magnetization reversal process, the secondary current $i_S$ is constant and corresponds to a magnetization current $+i\mu$ or $-i\mu$. The magnitude of the magnetization current $i_\mu$ depends on the width of the hysteresis in the magnetization curve, i.e. on the coercive field strength $H_C$, i.e., $i_\mu = l_{PE}/N \cdot H_C$ (for a primary current $i_P=0$ A). As soon as the magnetization in the core 103 reaches the positive or negative saturation magnetization $\pm M_{SAT}$, the secondary current $i_S$ begins to increase in the positive or negative direction, as mentioned above. Due to the symmetry of the hysteresis characteristic, the time profile of the secondary current $i_S$ is symmetrical about a mean value.

Figure 4:
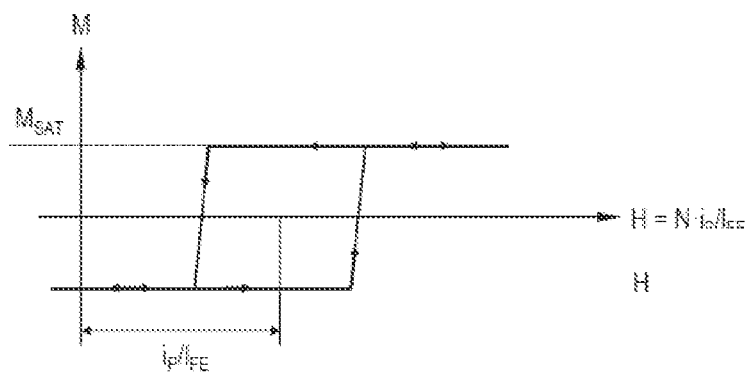
FIG. 4 shows the idealized course of the magnetization characteristic of the magnetic core in a freely oscillating current sensor with a primary current greater than zero.
Figure 5:
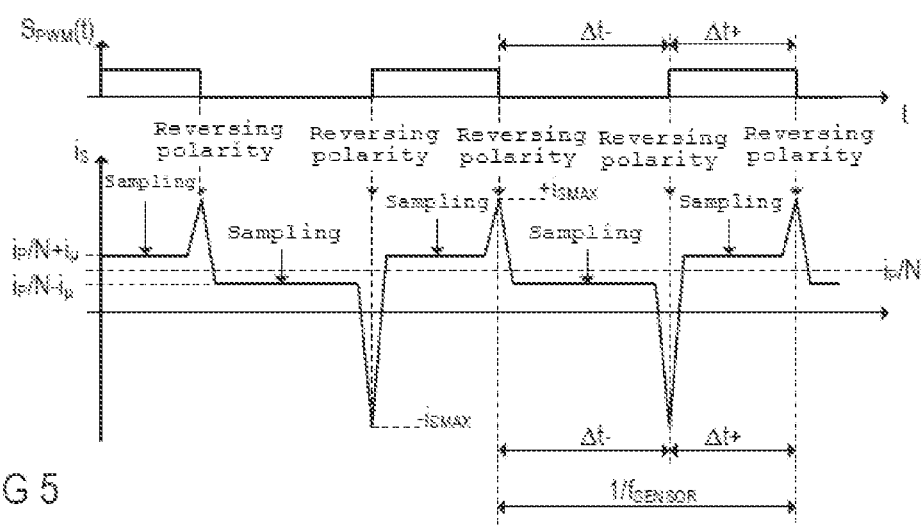
FIG. 5 shows the idealized course of the secondary current in a freely oscillating current sensor at a primary current greater than zero.

FIGS. 4 and 5 show the magnetization characteristic and the time profile of the secondary current $i_S$ for the case that the primary current $i_P$ is not equal to zero. The magnetic field generated by the primary current $i_P$ is superimposed in the core 103 with the magnetic field of the secondary current $i_S$, which is expressed in FIG. 4 as a shift of the magnetization characteristic along the abscissa (compared to FIG. 2). The associated time profile of the secondary current $i_S$ is shown in FIG. 5. This is similar to the case shown in FIG. 3, in which the primary current $i_P$ is zero, but with the difference that the secondary current $i_S$ is no longer symmetrical to the abscissa ($i_S=0$), but rather symmetrically to a straight line with $i_S=i_P/k$ which is shifted parallel thereto. That is to say, during the magnetization reversal process, the primary current $i_P$ and the secondary current $i_S$ have the same ratio k as the number of windings of the primary conductor 101 and the secondary conductor 102, apart from a hysteresis offset equal to the magnetization current $\pm i_\mu$. The ratio k corresponds to the number of turns N of the secondary conductor 102 when the number of turns of the primary conductor is 1.

There are various approaches to determining a measured value for the primary current. A first approach consists in evaluating the secondary current during the magnetization reversal process. Accordingly, the secondary current signal $i_S$ or the voltage $u_{CS}$ at the measuring resistor 105 is sampled during the magnetization reversal process (see FIG. 3). By sampling the signal representing the secondary current $i_S$ in the first half of a period of the secondary current $i_S$ (first measurement cycle), a measured current value $i_S[n-1]=(i_P/N)+i_\mu$ is obtained, and in the second half of the period (second measuring cycle) a measured current value $i_S[n]=(i_P/N)-i_\mu$. The hysteresis error caused by the magnetizing current can then be eliminated by averaging over the first and the second measuring cycle. The primary current $i_P$ at a sampling time n is calculated as follows:

$$i_P[n]=(N/2)\cdot(i_S[n-1]+i_S[n]). \quad (3)$$

Because the hysteresis of the magnetization characteristic has practically no influence on the measurement result, this current measurement method is very suitable for measuring very small currents. The measuring range extends from a few milliamps to kiloamps. During the magnetization reversal process of the magnetic core 103, the secondary current $i_S$ follows the primary current $i_P$ in accordance with the transmission ratio N:1. The secondary current $i_S$ is sampled during the magnetization reversal process at least once to obtain a measured value ($i_S+i_\mu$ or $i_S-i_\mu$) for determining the primary current $i_P$. During the magnetization reversal process, however, sampling can also take place repeatedly at a defined sampling rate which is significantly higher than an oscillation frequency of the sensor $f_{SENSOR}$. The secondary current $i_S$ is approximately constant and equal to $(i_P/N)\pm i_\mu$ during the magnetization reversal process and before magnetic saturation occurs in the core 103. This idealized approach can be used when the hysteresis characteristic of the magnetic core 103 is approximately rectangular.

Figure 6:
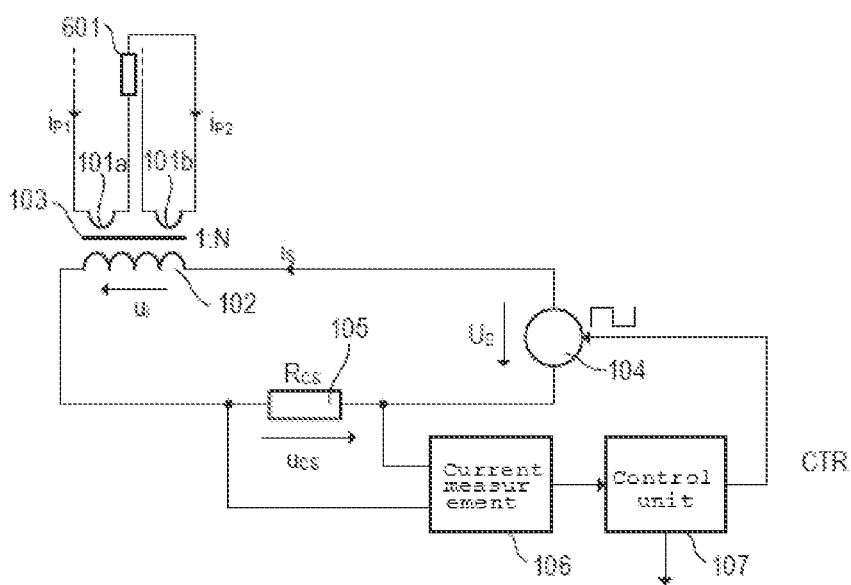
FIG. 6 shows a current sensor operating according to the flux gate principle, in particular for measuring differential currents and for detecting the strength of the primary current.

The procedure explained above with reference to FIGS. 1 to 5 can also be used for differential current measurement with only minor modifications to the current sensor circuit shown in FIG. 1. A differential current measurement is used, for example, in residual current circuit breakers. For this purpose, the primary winding 101 is divided into one first partial winding 101a and (at least) one second partial winding 101b. Accordingly, the primary current flowing through the first partial winding 101a is denoted by $i_{P1}$ and the primary current flowing through the second partial winding 101b is denoted by $i_{P2}$. The partial windings 101a and 101b can each consist of only a single turn and be oriented in such a way that the magnetic fields caused by the primary currents $i_{Pa}$ and $i_{Pb}$ at least partially compensate each other (destructively superimpose) and only the net primary current $i_{P1}-i_{P2}$ (effective primary current) generates a corresponding net magnetic field in the core 103. The net magnetic field is in turn superimposed by the magnetic field of the secondary current $i_S$. A correspondingly modified sensor is shown in FIG. 6. Apart from the fact that the example of FIG. 6 has two primary windings 101a, 101b through which an effective primary current $i_P=i_{P1}-i_{P2}$ flows, the example of FIG. 6 is the same as the example of FIG. 1. Depending on the orientation of the primary conductors 101a and 102b, a summation current measurement can also be carried out instead of a differential current measurement. More than two primary conductors can also be provided, so that theoretically a sum of any number of currents can be measured. The primary current in this case is $i_P=i_{P1}\pm i_{P2}\pm i_{P3}$, etc. In the case of differential current measurement, the designation $\Delta i_P$ is used below for the effective primary current (differential current)

In the example shown in FIG. 6, the two primary windings 101a and 101b are connected upstream or downstream of a load 601, so that the difference, i.e. the net primary current $i_{P1}-i_{P2}$, is only not equal to zero if, for example, in the area of the load 601 a leakage current (residual current) flows, which then corresponds exactly to the differential current $\Delta i_P=i_{P1}-i_{P2}$. The differential current $\Delta i_P$ is calculated from sampling values of the secondary current analogous to equation 3 as follows:

$$\Delta i_P[n]=N\cdot(i_S[n-1]+i_S[n])/2. \quad (4)$$

According to a second approach to determining a measured value for the primary current, the times of the magnetization reversal processes are evaluated. A magnetization reversal process begins with the polarity reversal of the voltage source 4 and ends when magnetic saturation is reached (which triggers the next polarity reversal of the voltage source 104). A cycle comprises two magnetization reversal processes, for example: from the positive saturation of the core to the reaching of the negative saturation and (after the polarity reversal of the voltage source 104) back to the reaching of the positive saturation. In FIG. 3, these times are denoted by $\Delta t_+$ and $\Delta t_-$, with $\Delta t_+$ denoting the time until reaching magnetic saturation in the positive direction (i.e., $+M_{SAT}$) and $\Delta t-$ the time until reaching magnetic saturation in the negative direction (i.e., $-M_{SAT}$).

The time intervals $\Delta t_-$ and $\Delta t_-$ (see FIG. 3) are not constant, but depend on the magnitude of the primary current. Furthermore, the magnetization reversal rate $dM/dt$ according to equation 2 is higher, the higher the amplitude $U_S$ of the voltage $\pm U_S$ generated by the voltage source 104. From equation 2 it follows:

$$dM/dt=-u_L/(N\cdot A\cdot\mu_0)=-(U_S-R_{CS}\cdot i_S)/(N\cdot A\cdot\mu_0). \quad (5)$$

Consequently, the higher the amplitude $U_S$ of the voltage $\pm U_S$ generated by the voltage source 104, the higher the oscillation frequency of the secondary current. The oscillation frequency $f_{SENSOR}$ of the sensor by integrating equation 5:

$$f_{SENSOR}=1/(\Delta t_++\Delta t_-), \text{ wherein} \quad (6a)$$

$$\Delta t_+=(\mu_0\Delta M\cdot N\cdot A)/(U_S+(i_P/N-i_\mu)\cdot R_{CS}), \quad (6b)$$

$$\Delta t_-=(\mu_0\Delta M\cdot N\cdot A)/(U_S-(i_P/N+i_\mu)\cdot R_{RCS}), \quad (6c)$$

Here, $\Delta M$ denotes the rise in magnetization during a magnetization reversal (e.g., $\Delta M=2\cdot M_{SAT}$) and $i_P/N+i_\mu$ denotes the secondary current during the respective magnetization reversal process. From equations 6a to 6c it can be seen that the oscillation frequency $f_{SENSOR}$ of the sensor depends on the one hand on the primary current itself and on the voltage amplitude $U_S$ of the voltage generated by the voltage source 104 and on the rise in magnetization $\Delta M$. A third approach to determining a measured value for the primary current can therefore consist in evaluating the oscillation frequency of the oscillator circuit. FIG. 5 also shows the signal $S_{PMW}(t)$, which is a binary signal and indicates the polarity of the voltage source 104. The signal $S_{PMW}(t)$ can readily be generated from the secondary current signal $i_S(t)$ by means of a comparator circuit. The signal $S_{PWM}(t)$ changes from a low level to a high level when a negative saturation is detected in the magnetic core 103 ($i_S\leq -i_{SMAX}$), and changes from a high level to a low level when a positive saturation is detected in the magnetic core 103 ($i_S\geq +i_{SMAX}$). The switching conditions $i_S\leq +i_{SMAX}$ and $i_S\geq +i_{SMAX}$ can be readily detected, for example, by means of comparators. The signal $S_{PWM}(t)$ is then the output signal of the comparator circuit which is used to detect the magnetic saturation (cf. FIG. 7, saturation detection 108). The signal $S_{PWM}(t)$ is a pulse width modulated (PWM) signal which has a variable frequency and whose duty cycle $D=\Delta t_+/(\Delta t_++\Delta t_-)$ depends on the effective primary current.

Figure 7:
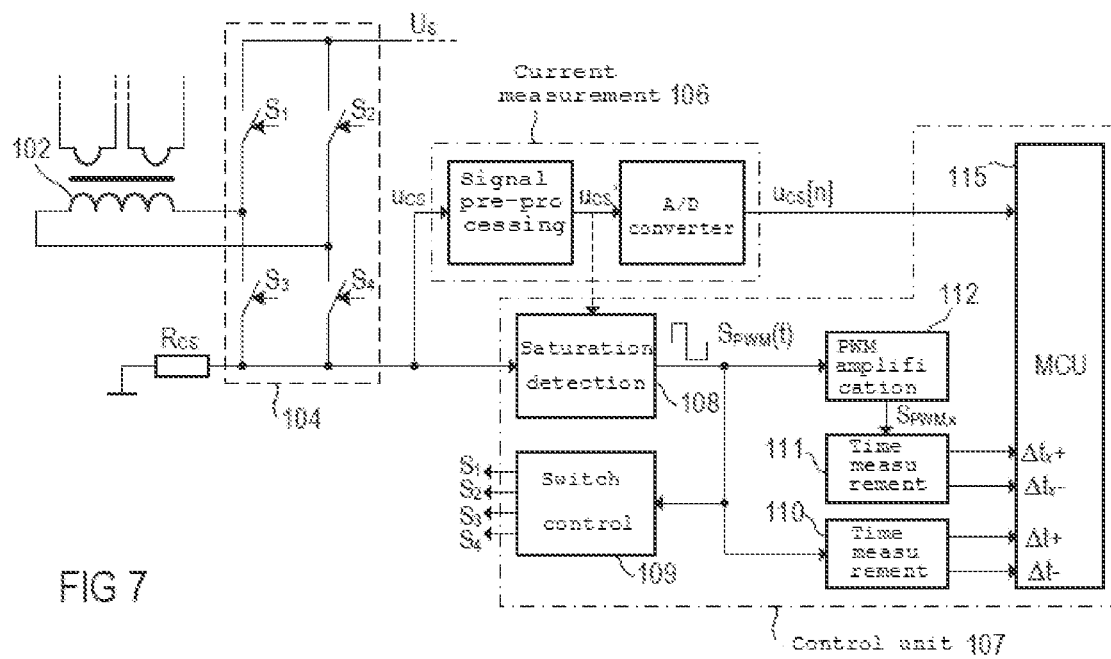
FIG. 7 is a block diagram of a current sensor circuit according to an embodiment.
Figure 12:
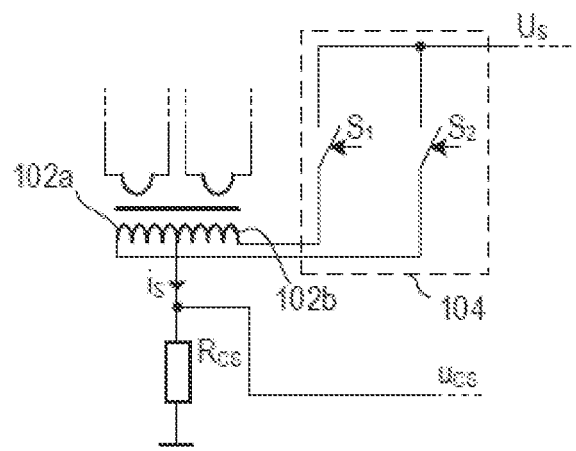
FIG. 12 illustrates an example of an alternative implementation of the secondary winding in a current sensor arrangement such as shown in FIG. 7, for example.

The example of FIG. 7 illustrates an exemplary implementation of the differential current sensor of FIG. 6. The signal processing included in the control unit 107 allows a comparatively high sensitivity of the current sensor, so that, for example, very small differential currents can be measured when measuring differential currents. The primary conductors 101a, 101b, the magnetic core 103 and the secondary winding 102 are the same as in the example of FIG. 6. The controllable voltage source 104 is implemented, for example, as an H-bridge with four semiconductor switches $S_1$, $S_2$, $S_3$, and $S_4$. An alternative implementation is shown in FIG. 12. When the circuit is in operation, either switches $S_1$ and $S_4$ are on while switches $S_2$ and $S_3$ are off, or vice versa (switches $S_2$ and $S_3$ are on while switches $S_1$ and $S_4$ are off). By switching the H-bridge (e.g., switching off $S_1$ and $S_4$, switching on $S_2$ and $S_3$) the polarity of the voltage applied to the secondary winding 102 is reversed. The secondary current $i_S$ flowing through the secondary winding 102 also flows through the measuring resistor $R_{CS}$, and the voltage drop $u_{CS}$ across the resistor $R_{CS}$ (current measurement signal) represents the secondary current $i_S$ ($u_{CS}=R_{CS}\cdot i_S$).

The current measurement signal $u_{CS}$ is fed to the current measurement unit 106. This unit is designed for analog pre-processing of the current measurement signal $u_{CS}$ and to digitize the pre-processed signal $u_{CS}'$. The resulting digital signal is denoted by $u_{CS}[n]$ in the example of FIG. 7. The analog preprocessing can comprise one of the following, for example: an amplification, a level adjustment, a filtering or the like. In the example shown, the digital signal $u_{CS}[n]$ is fed to a microcontroller 115 which is designed to calculate a measured value for the differential current $\Delta i_P$ (e.g., in accordance with equation 4). Instead of a microcontroller, another digital processing unit (programmable or hardwired) can also be used.

In case of a very small (differential) current, the quantization errors that arise when digitizing the optionally preprocessed current measurement signal $u_{CS}$ are relatively high (compared to the measured current value. The above-mentioned evaluation of the times $\Delta t_+$ and $\Delta t_-$ enables a somewhat more precise measurement (cf. also FIG. 5), wherein, in known implementations, the duty cycle D is utilized as the measured value for the (differential) current. The duty cycle D corresponds to the ratio $\Delta t_+/(\Delta t_++\Delta t_-)$ and is usually given in percent. In the example of FIG. 3, in which the primary current or the primary current difference is zero, the duty cycle is 0.5 or 50 percent. In the example of FIG. 5, in which the primary current or the primary current difference is positive, the duty cycle is less than 50 percent. In some cases the ratio $R=\Delta t_+/\Delta t_-$ is evaluated, which is practically equivalent to evaluating the duty cycle, since $D=R/(1+R)$. In both cases a division must be performed to calculate R or D.

In order to avoid the division for calculating the duty cycle or the pulse-pause ratio R, which is laborious to implement in a microcontroller or another digital processing unit, according to one exemplary embodiment, the difference $\Delta T=\Delta t_--\Delta t_+$ is calculated as the measured value for the effective primary current or the primary current difference. Analyses have shown that there is also a relatively linear relationship between the difference $\Delta T$ and the effective primary current. With an effective primary current of 0 A the difference $\Delta T$ is ideally 0, with a positive effective primary current the difference $\Delta T$ is positive and with a negative effective primary current the difference $\Delta T$ is negative. In the example shown in FIG. 7, the control unit 107 comprises a time measuring circuit 110 which is designed to measure the times $\Delta t_-$ and $\Delta t_+$. The microcontroller can then calculate the difference $\Delta T=\Delta t_--\Delta t_+$ very easily and efficiently and use it to generate a measured value for the effective primary current. Suitable time measuring circuits are known per se and are usually implemented using a clock generator and one or more counters. However, there is also the problem here that with a very small current to be measured, the time difference $\Delta T$ is very small and consequently the quantization error in the time measurement is relatively large compared to the measured value $\Delta T$. In order to increase the resolution, the clock frequency with which the counters of the time measuring circuit 110 are operated, could be increased. However, higher clock frequencies can cause other problems, such as in circuit design and in terms of the electromagnetic compatibility (EMC).

Figure 8:
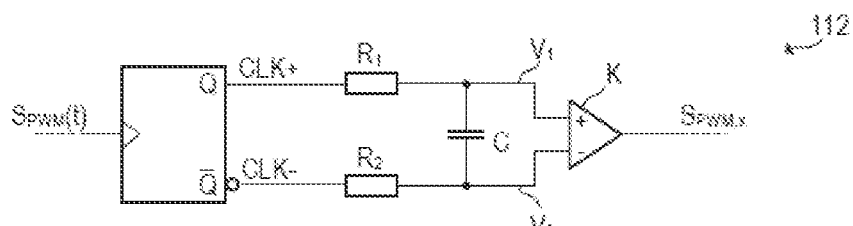
FIG. 8 illustrates an example of a circuit for adapting (amplifying) the duty cycle of a pulse-width-modulated signal.

In order to solve the problem of low resolution and to reduce the relative quantization error without having to increase the clock frequency for the counters used in the time measurement, the exemplary embodiment includes a special circuit which is referred to as a duty cycle amplifier and which is designed to increase the current-dependent modulation of the times $\Delta t_-$ and $\Delta t_+$. An exemplary implementation of the duty cycle amplifier circuit is shown in FIG. 8. This circuit makes it possible to map currents in the range from, e.g., −250 mA to 250 mA on a duty cycle of 30% to 70%. Without a duty cycle amplifier (with a current of −250 mA to 250 mA) the duty cycle would be in the range from 45% to 55%. The numerical values mentioned here are of course only illustrative examples. The actual values depend on the configuration of the current sensor.

The circuit from FIG. 8 comprises a toggle flip-flop for signal processing, which, depending on the PWM signal $S_{PWM}(t)$, which among other things indicates the polarity of the voltage source 104, generates two complementary binary signals CLK+ and CLK− with a defined edge steepness. The complementary binary signals CLK+ and CLK− are fed to a symmetrical low-pass circuit which is formed by the resistors $R_1$ and $R_2$ and the capacitor C. The resistances $R_1$ and $R_2$ are the same, so that both low-pass filters have the same time constant. The output voltages $V_1$ and $V_2$, which are available at the two terminals of the capacitor C, are fed to a comparator K, which indicates with a high level at the output when the condition $V_1>V_2$ is met. The output signal of the comparator is denoted by $S_{PWM,x}$. At this point it should be noted that instead of a single capacitor C, two capacitors can also be used. In this case a capacitor has one terminal connected to resistor $R_1$ and the other terminal to ground; the other capacitor would have one terminal connected to resistor $R_2$ and the other terminal to ground. The mode of operation of the duty cycle amplifier 112 is explained in more detail below with reference to the timing diagrams in FIGS. 9-11.

Figure 9:
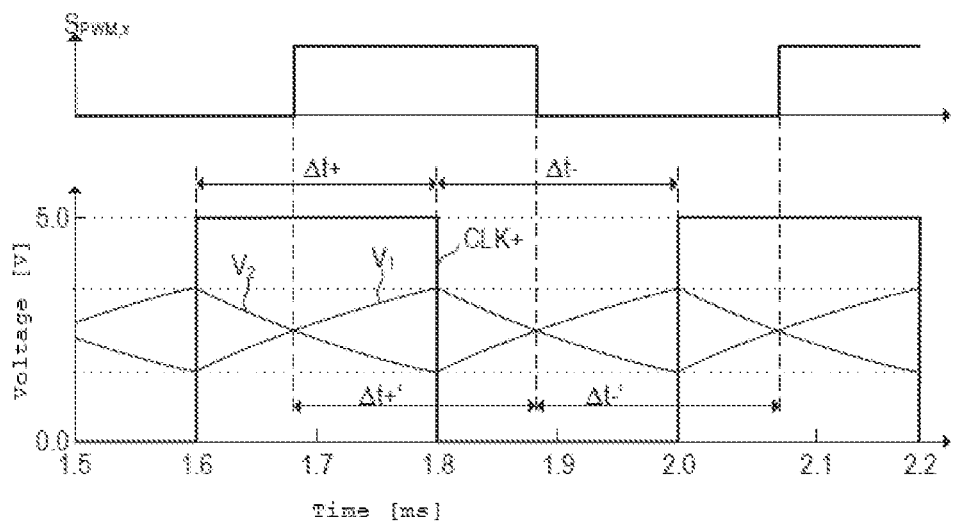
FIGS. 9-11 are timing diagrams to illustrate the operation of the circuit of FIG. 8.

FIG. 9 illustrates a case in which the effective primary current is 0 A and consequently the secondary current $i_S(t)$ oscillates symmetrically about the zero line (see FIG. 3). The duty cycle $D=\Delta t_+/(\Delta t_++\Delta t_-)$ is 0.5 in this case, i.e., $\Delta t_+=\Delta t_-$ (in the ideal case). FIG. 9 includes the time course of the signal CLK+. The complementary (inverted) signal CLK− is not shown for the sake of clarity. Furthermore, the signal curves of the voltages $V_1$ and $V_2$, which are fed to the comparator K, are illustrated. The oscillation frequency $f_{SENSOR}$ is 2.5 kHz in the example illustrated. A period $f_{SENSOR}^{-1}=\Delta t_++\Delta t_-$ therefore lasts 0.4 ms (see FIG. 9, on the time axis from 1.6-2.0 ms). In the first part of the period, the voltage $V_1$ increases according to the step response of the RC low-pass filter of FIG. 8. The steepness of the increase depends on the time constant of the low-pass (i.e., on the resistors $R_1$ and $R_2$ and the capacitance C). Likewise, the voltage $V_2$ drops exponentially (with the time constant of the low pass). The output signal $S_{PWM,x}$ of the comparator K indicates by a high level those time intervals in which the condition $V_1>V_2$ is met. The signal $S_{PWM,x}$ always changes the level when the signal curves of $V_2$ and $V_2$ cross.

Figure 10:
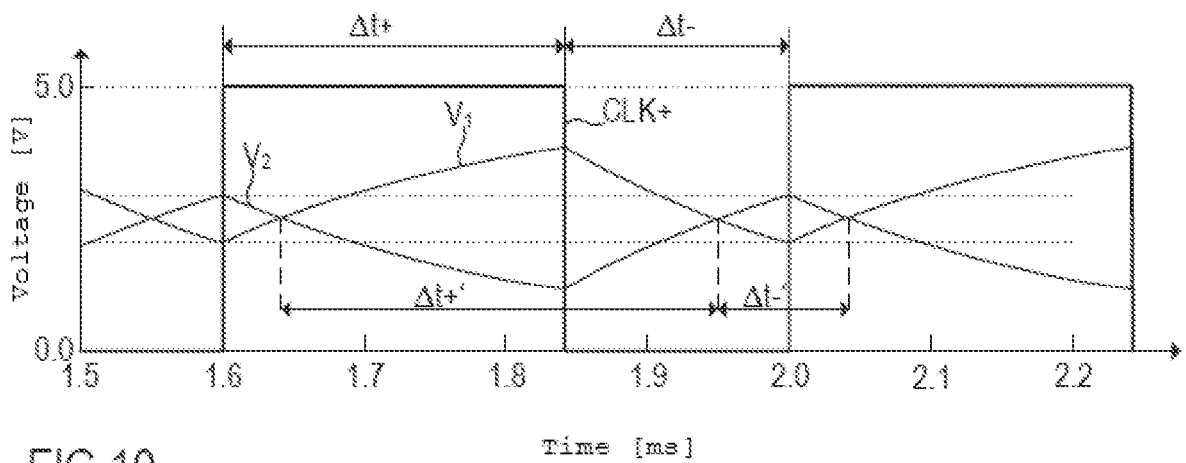
Figure 11:
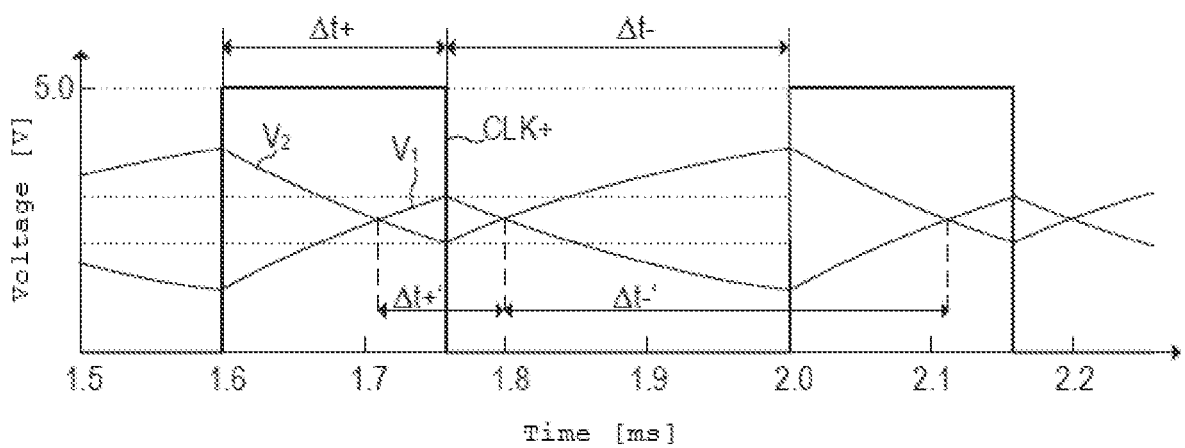

In case of a duty cycle of 0.5, the duty cycle amplifier only effects a phase shift, but the duty cycle remains at 0.5. Deviations of the duty cycle from the value 0.5 are amplified, however. FIG. 10 illustrates the same case as FIG. 9, but with a duty cycle D=0.6. FIG. 11 shows the same example with a duty cycle D=0.4. In both cases (FIGS. 10 and 11) the signals $V_1$ and $V_2$ are still symmetrical (similar to FIG. 9), but the intercept points of the signal curves of $V_1$ and $V_2$ are shifted.

The change in the intercept points of the signal curves of $V_1$ and $V_2$ is greater than the change in the duty cycle, which is why, in the case of FIG. 10, the output signal $S_{PWM,x}$ has a duty cycle $\Delta t_{x+}/(\Delta t_{x+}+\Delta t_{x-})$ of significantly more than 0.6. In the case of FIG. 11, the output signal $S_{PWM,x}$ has an "amplified" duty cycle $D^*=\Delta t_{x+}/(\Delta t_{x+}+\Delta t_{x-})$ of significantly less than 0.4. This is to say that the duty cycle deviations from the value 0.5, which dependent on the effective primary current, are amplified by the duty cycle amplifier (in both directions). Since, using the duty cycle amplifier, even small changes in the effective primary current can cause significant changes in the duty cycle, small changes in the effective primary current and thus also small changes in a differential current can be resolved more precisely in the case of differential current measurement without having to increase the clock frequency of the counters. Known approaches to increasing the sensitivity utilize several switchable measuring resistors (see FIG. 7, measuring resistor $R_{CS}$) with different resistance values, which is associated with increased effort and costs.

In the example of FIG. 7, the time measuring circuit 111 is designed to determine the times $\Delta t_{x+}$ and $\Delta t_{x-}$. The time measuring circuit 111 can be constructed in the same way as the time measuring circuit 110 and, as mentioned, include one or more counters. In some exemplary embodiments, only a single time measuring circuit can be provided. In some exemplary embodiments, the time measuring circuit 110 can be omitted. In this case, only the times $\Delta t_{x+}$ and $\Delta t_{x-}$ are evaluated for the current measurement (not the times $\Delta t_+$ and $\Delta t_-$). In some applications, however, it makes sense to evaluate both, the times $\Delta t_{x+}$ and $\Delta t_{x-}$ in the output signal $S_{PWMx}$ of the duty cycle amplifier 112 and the times $\Delta t_+$ and $\Delta t_-$ in the input signal $S_{PWM}$ of the duty cycle amplifier 112. In this case, two measuring ranges with different sensitivity can be implemented without having to adapt the resistance value of the measuring resistor $R_{CS}$. In some applications it can also be useful to provide several measuring ranges, wherein a different duty cycle amplifier with different characteristics (e.g., different time constants of the low passes) can be used for each measuring range.

The microcontroller 115 (see FIG. 7) receives the measured time values $\Delta t_{x+}$ and $\Delta t_{x-}$ and, according to one exemplary embodiment, calculates the difference $\Delta T_x = \Delta t_{x-} - \Delta t_{x+}$ as a measured value for the effective primary current. In other exemplary embodiments, the amplified duty cycle $D^* = \Delta t_{x+}/(\Delta t_{x+} + \Delta t_{x-})$ or the ratio $R^* = \Delta t_{x+}/\Delta t_{x-}$ is calculated as a measured value for the effective primary current (e.g. the current difference $\Delta i_P$). As already mentioned, a difference is much easier to implement than a division in digital computing circuits. Furthermore, the sensor frequency $f_{SENSOR} = (\Delta t_{x+} + \Delta t_{x-})^{-1}$ can be calculated in the microcontroller. In practice, the period $f_{SENSOR}^{-1} = (\Delta t_{x+} + \Delta t_{x-})$ is calculated in order to avoid calculating the reciprocal value, for which a division would also be necessary. As mentioned, the sensor frequency or the period also depends on the effective primary current and can serve as a measured value for the effective primary current.

In one exemplary embodiment, the microcontroller 115 is designed to carry out a plausibility check in that the primary current is determined in two or more ways. A first measured value can be determined based on a measurement of the secondary current (cf. FIG. 5 and Equations 3 and 4). A second measured value can be determined based on the time difference $\Delta T_x = \Delta t_{x-} - \Delta t_{x+}$ (when using a duty cycle amplifier) or $\Delta T = \Delta t_- - \Delta t_+$ (if no duty cycle amplifier is used). Alternatively, the duty cycle D or D* can be calculated. A third measured value can be determined based on the sensor frequency $f_{SENSOR}$ (or the duration of the period $f_{SENSOR}^{-1}$). The microcontroller 115 can check whether, for example, the first and the second measured value are consistent and match (taking into account the usual tolerances). If this is not the case, the microcontroller can display an error or output a warning signal, which indicates that the measurement results may be unreliable.

FIG. 12 illustrates an alternative implementation of the controllable voltage source 104. Instead of the transistor H-bridge of FIG. 7, only two individual electronic switches $S_1$ and $S_2$ are needed. In this case, the secondary coil is divided into two parts (partial windings 102a and 102b) or has a center tap which is connected to a ground node via the measuring resistor $R_{CS}$, for example. The external terminals of the secondary winding are alternately connected to the supply voltage $U_S$ using switches $S_1$ and $S_2$. To reverse the direction of the secondary current, switch $S_1$ is switched off and switch $S_2$ is switched on, or vice versa. Here, the secondary current always flows through only part of the secondary coil 102. Otherwise, the exemplary embodiment of FIG. 12 functions in the same way as the example of FIG. 7 and reference is made to the associated description above.

The current sensors described here are relaxation oscillators, the specific implementation of the oscillator being irrelevant.

The exemplary embodiments described here are briefly summarized below. This is not a complete list, but merely an exemplary summary of some important aspects. A first embodiment relates to a circuit for measuring current. This circuit comprises an oscillator circuit with a magnetic core, at least one primary conductor which is magnetically coupled to the magnetic core and at least one secondary conductor magnetically coupled to the magnetic core (cf., for example, FIG. 7, magnetic core 103, primary conductors 101a and 101b and secondary conductor 102). The oscillator circuit is designed to magnetize the magnetic core regularly in opposite directions up to a maximum value (e.g., saturation magnetization $M_{SAT}$, cf., FIG. 2) by controlling the at least one secondary conductor. The oscillator circuit is also designed to generate an oscillator signal (cf. FIG. 7, signal $S_{PWM}$) which alternates from a first state to a second state, or vice versa (e.g. alternating from high level to low level, and vice versa) when the maximum value (in the positive or negative direction) is reached. The times that the oscillator signal dwells in the first and the second state are dependent on the effective primary current (e.g., differential current $\Delta i_P$) that flows through the at least one primary conductor.

According to one exemplary embodiment, the circuit for current measurement further comprises a time measuring circuit (see FIG. 7, numeral 110) which is designed to regularly determine a first time period $\Delta t_+$ and a second time period $\Delta t_-$ that the oscillator signal dwells in the first or the second state in an oscillation period. An evaluation unit (see FIG. 7, microcontroller 115) determines a difference $\Delta T$ between the first time period $\Delta t_+$ and the second time period $\Delta t_-$. Based on the difference, a measured value for the effective primary current can be determined.

According to a further exemplary embodiment, the circuit for current measurement has, in addition to the oscillator circuit mentioned, a duty cycle amplifier circuit (see FIG. 7, numeral 112, and FIG. 8). As mentioned, the oscillator signal alternates between two states (high level and low level) and therefore has a duty cycle $D = \Delta t_+/(\Delta t_+ + \Delta t_-)$. The duty cycle amplifier circuit is designed to increase a deviation of the duty cycle D that is dependent on the effective primary current (e.g., differential current $\Delta i_P$) from a reference value. The reference value is, for example, 0.5, which is equivalent to $\Delta t_+ = \Delta t_-$. The reference value corresponds to the duty cycle value that is present with an effective primary current of zero. In one exemplary embodiment, the duty cycle amplifier circuit has at least one low pass. The increase in the duty cycle is substantially determined by a time constant of the low pass. The low pass can be a first-order low pass and/or in particular have one or more RC low passes. The steepness of the capacitor charging curve(s) determine(s) the characteristics of the duty cycle amplifier circuit. As in the previous example, the dwell times $\Delta t_{x+}$ and $\Delta t_{x-}$ in the high-level or low-level state can be used to measure the effective primary current. Either the difference $\Delta T_x$ between the first period $\Delta t_{x+}$ and the second period $\Delta t_{x-}$, the ratio $\Delta t_{x+}/\Delta t_{x-}$ or the "amplified" duty cycle $D^* = \Delta t_{x+}/(\Delta t_{x+} + \Delta t_{x-})$ can be used to determine a measured value for the effective primary current.

According to a further exemplary embodiment, the circuit for current measurement has, in addition to the oscillator circuit mentioned and the time measuring circuit (for measuring the times $\Delta t_+$ and $\Delta t_-$ and/or $\Delta t_{x+}$ and $\Delta t_{x-}$) mentioned. The circuit also comprises an evaluation unit (e.g., a microcontroller 115, see FIG. 7), which is designed to determine a first measured value (e.g., $\Delta t_+ - \Delta t_-$) for the effective primary current based on the times (e.g., $\Delta t_+$ and $\Delta t_-$) that the oscillator signal $S_{PMW}$ dwells in the first and the second state, and—in parallel—to determine the second measured value for the effective primary current based on a secondary current flowing in the secondary conductor (see FIG. 7, secondary current $i_S$, and FIG. 5).

Through the simultaneous use of mutually independent principles for evaluating the oscillation of the sensor, namely the evaluation of the secondary current shown in FIG. 5 and the evaluation of the times $\Delta t_+$ and $\Delta t_-$ of the pulse-width modulated oscillator signal (and/or the times $\Delta t_{x+}$ and $\Delta t_{x-}$ of the pulse-width-modulated output signal of the duty cycle amplifier), on the one hand a plausibility check can be carried out and on the other hand an improvement of the accuracy of the measurement result by averaging (averaging the first and the second measured value mentioned). For the plausibility check, the two measured values are compared, and if the two measured values deviate too much from one another, it can be assumed that the current sensor is not working properly and the measurement results may be potentially unreliable. The averaging of two measured values determined in parallel does not reduce the available bandwidth of the current sensor—unlike the averaging of several measured values determined one after the other.

The exemplary embodiments described here can be implemented in different ways. For example, all electronic circuits (apart from primary and secondary windings and a few other separate components) can be integrated into a single application-specific integrated circuit (ASIC). The integrated circuit can, in particular, include a microcontroller core with a processor (cf. FIG. 7, microcontroller 115) which is programmed by means of software instructions in such a way that the functions described here are carried out. Alternatively, at least in part, hard-wired or one-time programmable (OTP) logic circuits can also be used. The circuits can also be implemented without programmable logic.

Parts of the circuits illustrated, for example, in FIG. 7, such as the circuit for saturation detection 108, can also be included in the microcontroller 115. The circuit for saturation detection 108 can be implemented on the one hand by a simple comparator with two switching thresholds ($+i_{SMAX}$, $-i_{SMAX}$, cf. FIG. 5). The detection of reaching the maximum current $\pm i_{SMAX}$ can also be carried out by the microcontroller on the basis of the digitized current signal (depending on whether the sampling rate is sufficient).

Finally, it should be mentioned that the exemplary embodiments described above can be combined. The mentioned difference formation $\Delta t_+ - \Delta t_-$ can be used with or without duty cycle amplification. The averaging and the aforementioned plausibility check can also be carried out with and without duty cycle amplification. In all exemplary embodiments, instead of the difference $\Delta t_+ - \Delta t_-$, a the "amplified" duty cycle or the ratio of the two times $\Delta t_{x+}$ and $\Delta t_{x-}$ can be used to determine a current measurement value. The conversion of times/counter readings can be calibrated and implemented, for example, by means of characteristics stored in the microcontroller. Here, for example, an interpolation between values stored in a lookup table can also be considered.

The invention claimed is:

1. A circuit, having:
    an oscillator circuit with a magnetic core with at least one primary conductor magnetically coupled to the magnetic core, and with at least one secondary conductor magnetically coupled to the magnetic core, the oscillator circuit being designed to magnetize the magnetic core regularly in opposite directions up to a maximum value by controlling the at least one secondary conductor, and which is further designed to generate an oscillator signal which alternates from a first state to a second state, or vice versa, when the maximum value is reached;
    a time measuring circuit which is designed to regularly determine a first time period and a second time period that the oscillator signal dwells in the first or the second state in an oscillation period; and
    an evaluation unit which is designed to determine a difference between the first time period and the second time period and, based thereon, to determine a measured value for the effective primary current flowing through the at least one primary conductor.

2. The circuit according to claim 1, wherein the at least one primary conductor comprises a first and a second conductor which are coupled to the magnetic core in such a way that the effective primary current corresponds to the difference of the currents flowing through the first and the second conductor.

3. The circuit of claim 1, further having: a duty cycle amplifier circuit which is designed to increase a deviation of the duty cycle of the oscillator signal from a reference value, which deviation is dependent on the effective primary current, and to provide a modified oscillator signal with the increased duty cycle.

4. The circuit of claim 3, further having:
    a further time measuring circuit which is designed to regularly determine a third time period and a fourth time period that the modified oscillator signal dwells in a first and a second state in an oscillation period, wherein the evaluation unit is further designed to determine a measured value for the effective primary current based on the third and fourth time period.

5. The circuit according to claim 1, wherein the evaluation unit is designed to determine a first measured value for an effective primary current based on the first and the second time period and, in parallel, to determine a second measured value for the effective primary current based on a secondary current flowing in the secondary conductor.

6. The circuit according to claim 5,
    wherein the duty cycle amplifier circuit has at least one low pass, and wherein the increase in the duty cycle depends on a time constant of the low pass.

7. The circuit of claim 1, further having: an evaluation unit which is designed to determine a measured value for the effective primary current, based on the times that a modified oscillator signal provided by the duty cycle amplifier circuit dwells in a first and a second state.

8. A circuit, having: an oscillator circuit with a magnetic core with at least one primary conductor which is magnetically coupled to the magnetic core, and with at least one secondary conductor which is magnetically coupled to the magnetic core, the oscillator circuit being designed to magnetize the magnetic core regularly in opposite directions up to a maximum value by controlling the at least one secondary conductor, and which is further designed to generate an oscillator signal which has a duty cycle which depends on the effective primary current; and
    a duty cycle amplifier circuit which is designed to increase a deviation of the duty cycle from a reference value which deviation is dependent on the effective primary current.

9. The circuit according to claim 8, wherein the reference value corresponds to the duty cycle that occurs when the effective primary current is zero.

10. A circuit, having: an oscillator circuit with a magnetic core with at least one primary conductor which is magnetically coupled to the magnetic core, and with at least one secondary conductor which is magnetically coupled to the magnetic core, the oscillator circuit being designed to magnetize the magnetic core regularly in opposite directions up to a maximum value by controlling the at least one secondary conductor, and which is further designed to generate an oscillator signal which alternates from a first state to a second state, or vice versa, when the maximum value is reached; and an evaluation unit which is designed to determine a first measured value for an effective primary current which flows through the at least one primary conductor, based on the times that the oscillator signal dwells in the first and the second state, and, in parallel, to determine a second measured value for the effective primary current based on a secondary current flowing in the secondary conductor.

11. The circuit according to claim 10, wherein the evaluation unit is further designed to check the measured values for plausibility by comparing the first with the second measured value.

12. The circuit according to claim 11, wherein the evaluation unit is further designed to calculate a third measured value from the first and the second measured values.

13. The circuit according to claim 12, wherein the evaluation unit is further designed to average the first and the second measured values.

14. A method, comprising the steps of: alternating magnetizing a magnetic core to a maximum value in the positive and negative directions by controlling at least one secondary conductor which is magnetically coupled to the magnetic core;
   generating an oscillator signal which alternates between a first state and a second state, whereby the alternating magnetization processes are indicated;
   determining a first time period and a second time period that the oscillator signal dwells in the first or the second state in an oscillation period; and
   determining a measured value for an effective primary current, which flows through at least one primary conductor which is magnetically coupled to the magnetic core, based on a difference between the first time period and the second time period.

15. A method, comprising the steps of:
   alternating magnetizing a magnetic core to a maximum value in the positive and negative directions by controlling at least one secondary conductor which is magnetically coupled to the magnetic core;
   generating an oscillator signal which alternates between a first state and a second state, whereby the alternating magnetization processes are indicated;
   generating a modified oscillator signal with a duty cycle that deviates more from a reference value than a corresponding duty cycle of the oscillator signal and that depends on an effective primary current that flows through at least one primary conductor which is magnetically coupled to the magnetic core.

16. A method, comprising the steps of:
   alternating magnetizing a magnetic core to a maximum value in the positive and negative directions by controlling at least one secondary conductor which is magnetically coupled to the magnetic core;
   generating an oscillator signal which alternates between a first state and a second state, whereby the alternating magnetization processes are indicated;
   determining a first measured value for an effective primary current, which flows through at least one primary conductor which is magnetically coupled to the magnetic core, based on the times that the oscillator signal dwells in the first and the second state, and, in parallel,
   determining a second measured value for the effective primary current based on a secondary current signal which represents the current flowing through the at least one secondary conductor.

17. The method according to claim 16, further comprising:
   calculating a third measured value based on the first and the second measured value for the effective primary current; and/or
   carrying out a plausibility check by comparing the first with the second measured value.

* * * * *